United States Patent
Kim et al.

(10) Patent No.: US 7,457,121 B2
(45) Date of Patent: Nov. 25, 2008

(54) PLASMA DISPLAY MODULE

(75) Inventors: Sok-San Kim, Suwon-si (KR); Ki-Jung Kim, Suwon-si (KR); Tae-Kyoung Kang, Suwon-si (KR); Myoung-Kon Kim, Suwon-si (KR); Won-Sung Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 407 days.

(21) Appl. No.: 11/215,017

(22) Filed: Aug. 31, 2005

(65) Prior Publication Data

US 2006/0133046 A1 Jun. 22, 2006

(30) Foreign Application Priority Data

Dec. 16, 2004 (KR) ............... 10-2004-0107120

(51) Int. Cl.
*H05K 7/20* (2006.01)
*H01J 7/24* (2006.01)
*B32B 3/26* (2006.01)

(52) U.S. Cl. .................. 361/704; 313/46; 361/690; 361/707; 361/708; 361/715; 428/319.1

(58) Field of Classification Search .......... None
See application file for complete search history.

(56) References Cited

U.S. PATENT DOCUMENTS

| | | | |
|---|---|---|---|
| 5,831,374 A | 11/1998 | Morita et al. | |
| 6,794,026 B2 * | 9/2004 | Ebihara et al. | 428/319.1 |
| 6,979,243 B2 * | 12/2005 | Watanabe | 445/24 |
| 7,176,605 B2 * | 2/2007 | Bae et al. | 313/46 |
| 7,292,440 B2 * | 11/2007 | Cho et al. | 361/704 |
| 2005/0068738 A1 * | 3/2005 | Kim et al. | 361/704 |

FOREIGN PATENT DOCUMENTS

| | | |
|---|---|---|
| CN | 1174395 | 2/1998 |
| CN | 1397999 | 2/2003 |
| JP | 2003-131581 | 5/2003 |
| JP | 2004-168867 | 6/2004 |
| KR | 1998-0011613 | 4/1998 |
| KR | 2003-0006964 | 1/2003 |

OTHER PUBLICATIONS

Korean Office action for Korean patent application No. 10-2004-0107120 issued on Jul. 27, 2006.
Office action from the Chinese Patent Office issued in Applicant's corresponding Chinese Patent Application No. 200510138095.4 dated Jun. 6, 2008.

* cited by examiner

*Primary Examiner*—Gregory D Thompson
(74) *Attorney, Agent, or Firm*—Robert E. Bushnell, Esq.

(57) ABSTRACT

A plasma display module with reduced driving noise and improved a heat dissipating performance. The plasma display module includes a chassis base, a plasma display panel arranged at a front portion of the chassis base, the plasma display panel being adapted to display images, a heat dissipation sheet arranged between the plasma display panel and the chassis base, the heat dissipation sheet including a plurality of pores, wherein a porosity of the heat dissipation sheet varies with distance from the plasma display panel, and a circuit unit arranged at a back portion of the chassis base to drive the plasma display. The heat dissipation sheet may be made out of three separate sheet materials, each sheet having a different porosity.

17 Claims, 9 Drawing Sheets

FRONT ←→ BACK

FRONT ←→ BACK

PLASMA DISPLAY MODULE

CLAIM OF PRIORITY

This application makes reference to, incorporates the same herein, and claims all benefits accruing under 35 U.S.C. § 119 from an application for PLASMA DISPLAY MODULE earlier filed the Korean Intellectual Property Office on the of Dec. 16, 2004 and there duly assigned the Serial No. 10-2004-0107120.

BACKGROUND OF THE INVENTION

1. Field of the Invention

The present invention relates to a plasma display module, and more particularly, to a plasma display module having an improved structure capable of improved a heat dissipating performance while being able to reduce noise and reduce vibrations.

2. Description of the Related Art

A plasma display module is a flat panel display module that displays images using a gas discharge phenomenon, and is considered to be the next generation flat panel display module able to replace a cathode ray tube (CRT) since it has excellent display characteristics such as display capacity, brightness, contrast, residual image, and viewing angle. However, one shortcoming with plasma display modules is that the heat dissipation characteristics are limited, and noise and vibrations generated during the functioning of the display are not adequately filtered out so that they hinder the performance of the plasma display module.

For example, U.S. Pat. No. 5,831,374 to Morita et al discloses a plasma display panel using high orientation graphite as a heat dissipation sheet. The high orientation graphite is an anisotropic heat conductive material, a thermal conductivity of which in a plane direction thereof is about 5 times higher than that in a thickness direction thereof. However, the high orientation graphite is also a hard material that lacks a buffer property, and has problems such that the discharge vibration or noise generated by the plasma display panel is transmitted to the outside. Therefore, what is needed is an improved design for a plasma display module that not only dissipates generated heat, but also has an improved buffer property and effectively attenuates produced noise and vibrations.

SUMMARY OF THE INVENTION

It is therefore an object of the present invention to provide an improved design for a plasma display module.

It is also an object of the present invention to provide a design for a plasma display module where not only is heat dissipated effectively, but also vibrations and noise are effectively attenuated.

It is still an object of the present invention to provide a design for a plasma display module with improved head dissipation ability while having an improved buffer property.

It is further an object of the present invention to provide a plasma display module capable of preventing the temperature of a plasma display panel from rising locally while improving a heat dissipation performance.

These and other objects can be achieved by a plasma display module that includes a chassis base, a plasma display panel arranged at a front portion of the chassis base, the plasma display panel being adapted to display images, a heat dissipation sheet arranged between the plasma display panel and the chassis base, a front portion of the heat dissipation sheet being closest to the plasma display panel and a back portion of the heat dissipation sheet being closest to the chassis base, the heat dissipation sheet including a plurality of pores, wherein a porosity of the heat dissipation sheet varies with distance from the plasma display panel, and a circuit unit arranged at a back portion of the chassis base and adapted to drive the plasma display panel.

The heat dissipation sheet can include at least two sheets, each sheet having different porosities from each other. The heat dissipation sheet can be made of a porous carbon material, or can be formed of one or more of Al, Cu, Ag and Ni. The front portion of the heat dissipation sheet can be attached onto a facing surface of the plasma display panel, and the back portion of the heat dissipation sheet can be separated from the chassis base.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
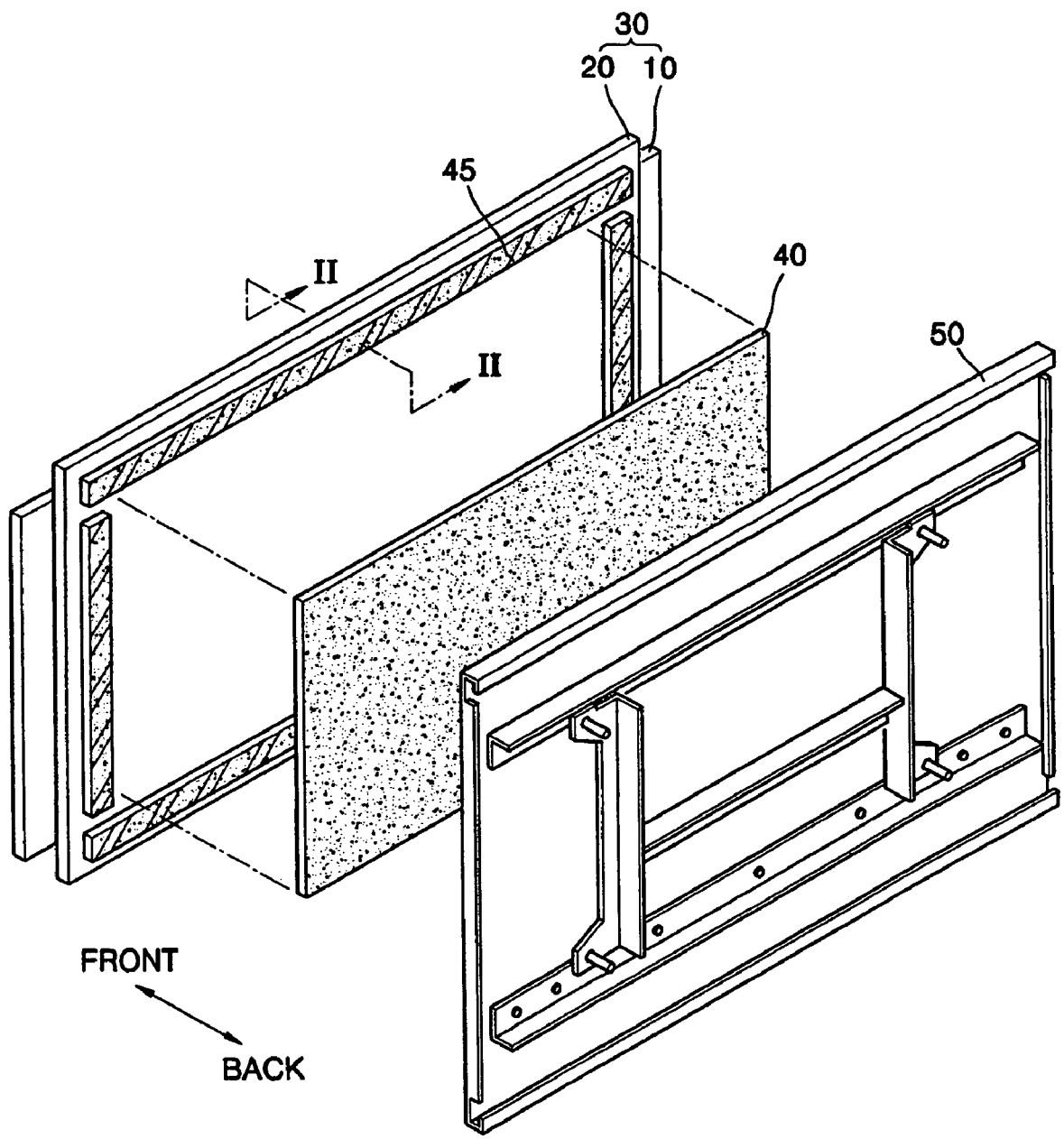
FIG. 1 is an exploded perspective view of a plasma display module.

Turning now to the figures, FIG. 1 is an exploded perspective view of a plasma display module. Referring to FIG. 1, the plasma display module includes a chassis base 50, a plasma display panel 30 supported in front of the chassis base 50, the plasma display panel 30 displaying images, and a circuit unit (not shown) supported at a rear portion of the chassis base 50 that drives the plasma display panel 30. In addition, a heat dissipation sheet 40 is positioned between the chassis base 50 and the plasma display panel 30.

The plasma display panel 30 that displays images using a discharge phenomenon generates a lot of heat, and thus the heat dissipation sheet 40 is positioned between the plasma display panel 30 and the chassis base 50 to dissipate the generated heat. The chassis base 50 is made of aluminum which has excellent heat conductive characteristics so that chassis base 50 can serve as a heat dissipation plate for the plasma display panel 30. A dual-adhesive tape 45 is attached along the outer portion of the heat dissipation sheet 40, and the plasma display panel 30 and the chassis base 50 are coupled to each other by the dual-adhesive tape 45.

Figure 2:
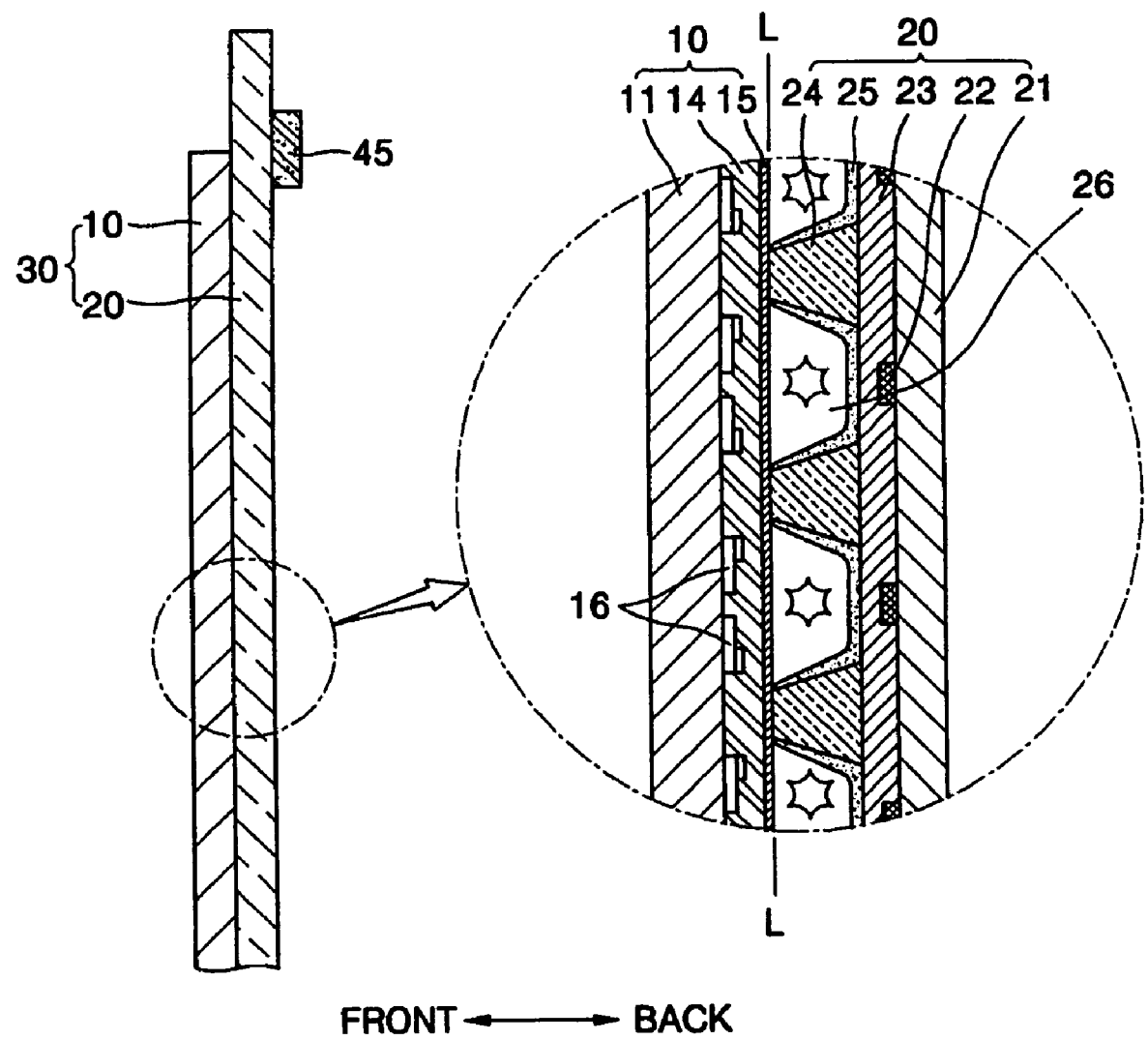
FIG. 2 is a cross-sectional view of the plasma display panel taken along line II-II of FIG. 1.

Turning now to FIG. 2, FIG. 2 is a cross-sectional view of the plasma display module of FIG. 1 taken along line II-II of FIG. 1. For the sake of convenience, an enlarged cross-sectional view of FIG. 2 shows a front panel 10 and a back panel 20 that are rotated at 90° angles with respect to each other at line L-L. The plasma display panel includes the front panel 10 and the back panel 20 coupled to each other, and the front panel 10 includes discharge sustain electrode pairs 16 formed on a front substrate 11, a front dielectric layer 14 covering the sustain electrode pairs 16, and a protective layer 15 covering the front dielectric layer 14. In addition, the back panel 20 includes address electrodes 22 formed on a back substrate 21, a back dielectric layer 23 covering the address electrodes 22, barrier ribs 24 defining discharge cells 26, and a phosphor layer 25 deposited in the discharge cells 26.

When a predetermined alternating current (AC) voltage is applied between the discharge sustain electrode pair 16, a sustain discharge occurs between the discharge sustain electrodes of the pair 16 producing ultraviolet rays, and the phosphor layer 25 is excited by ultraviolet rays and emits visible light. This emitted visible light causes a predetermined image to be displayed by the visible light. Although it is not shown in FIG. 2, a discharge gas is filled within the discharge cells 26. During sustain discharge, the discharge pressure of the discharge gas fluctuates causing the plasma display panel to vibrate back and forth. When a high orientation graphite is used as the heat dissipation sheet, the vibrations of the plasma display panel are transmitted to an outside and cause driving noises. In addition, the circuit unit (not shown) also generates vibrations by repeating operations of initialization, light emission sustaining, and extinguishing. Thus, since the circuit unit does not include any structure for absorbing the vibrations, the noise is not absorbed and quality of the display is then degraded.

Figure 3:
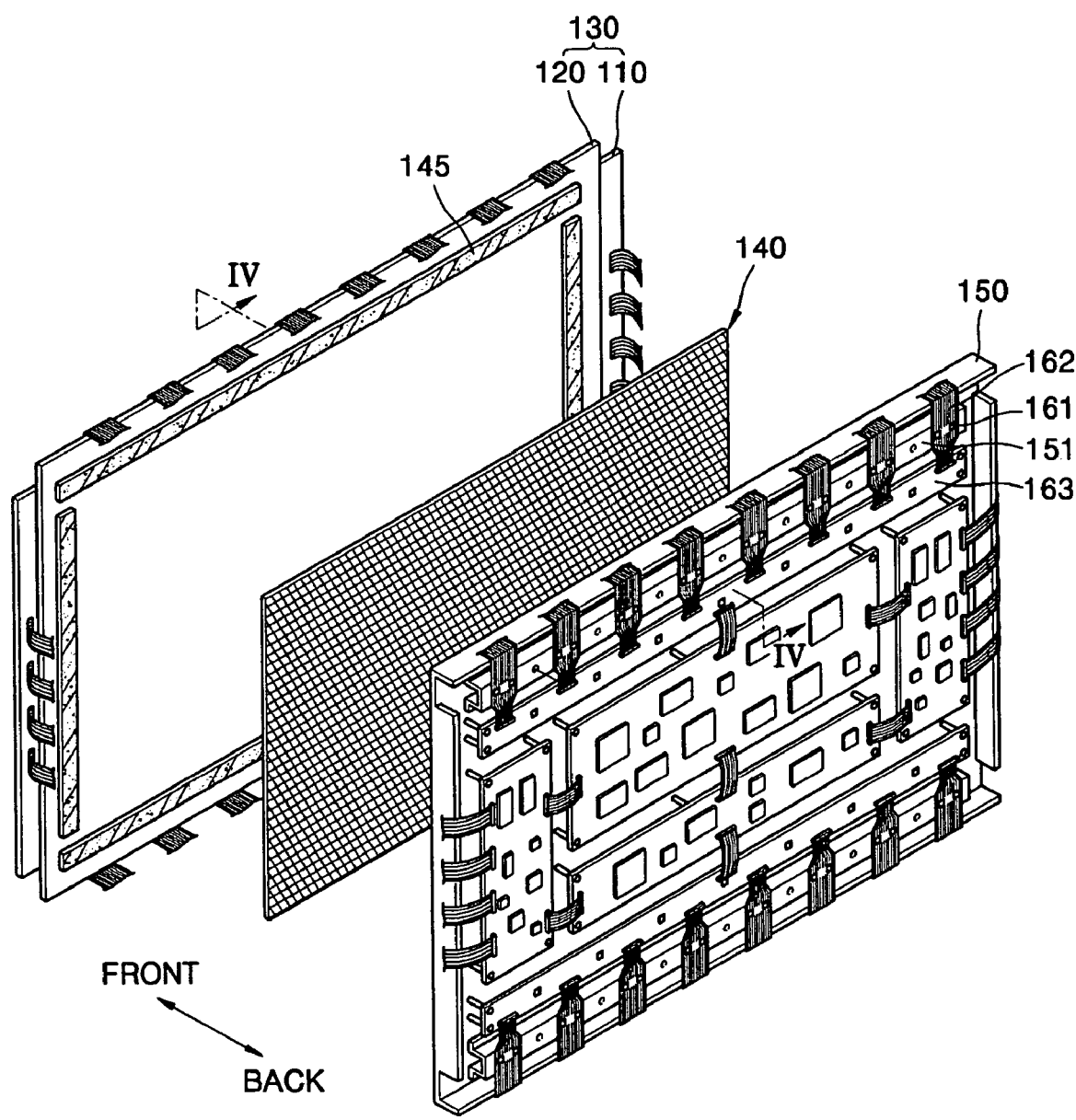
FIG. 3 is an exploded perspective view of a plasma display module according to a first embodiment of the present invention.
Figure 4:
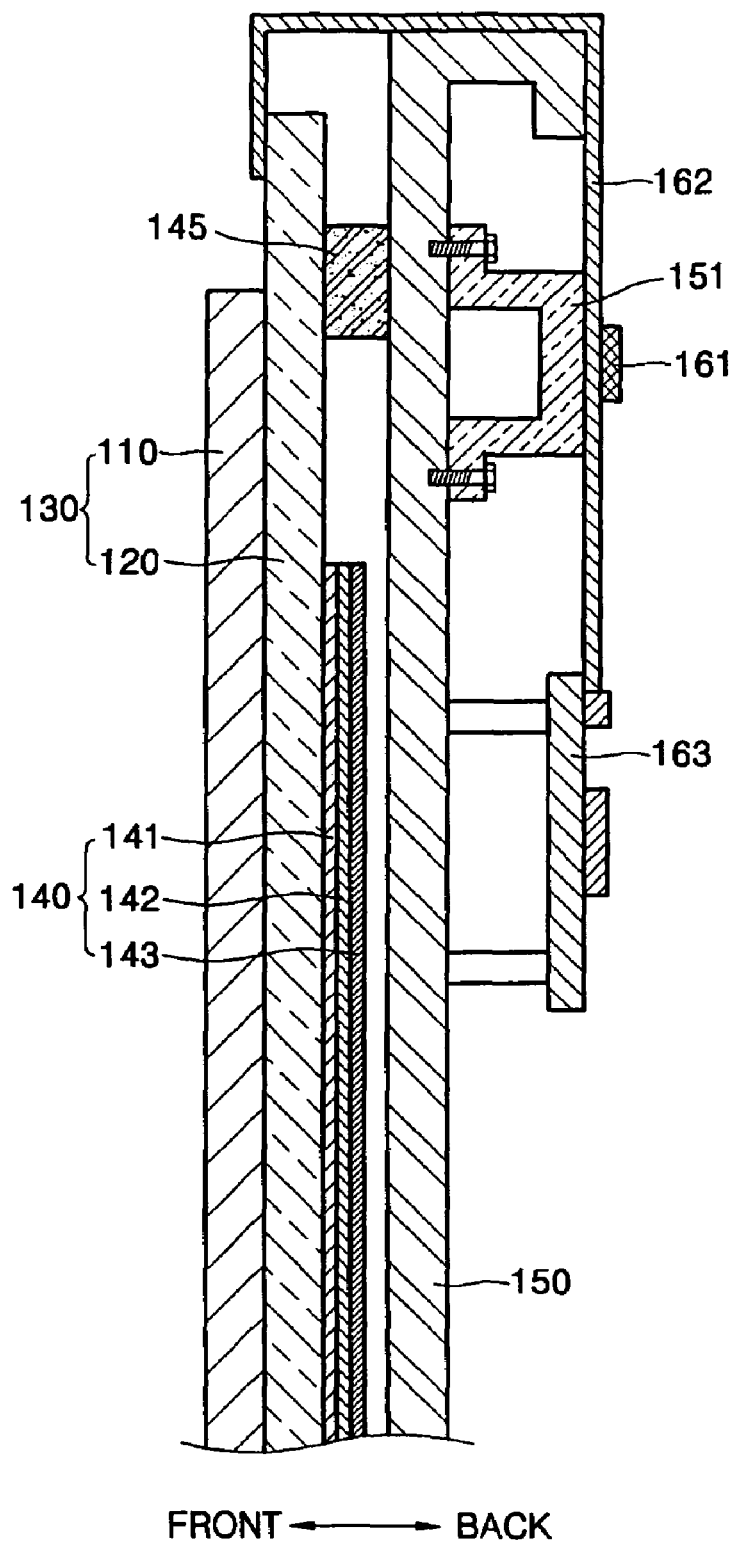
FIG. 4 is a cross-sectional view of the plasma display panel taken along line IV-IV of FIG. 3.

Turning now to FIGS. 3 and 4, FIG. 3 is an exploded perspective view of a plasma display module according to a first embodiment of the present invention, and FIG. 4 is a cross-sectional view of the plasma display module of FIG. 3 taken along line IV-IV of FIG. 3. The plasma display module of FIGS. 3 and 4 includes a chassis base 150, a plasma display panel 130 that displays images and is supported at a front portion of the chassis base 150, and a circuit unit supported at a rear portion of the chassis base 150 that drives the plasma display panel 130. In addition, a heat dissipation sheet 140 that is made of a stack of sheets of materials having different porosities from each other is positioned between the chassis base 150 and the plasma display panel 130.

The plasma display panel 130 is formed by coupling a front panel 110 to a back panel 120. The plasma display panel displays images using a discharge phenomenon. The plasma display panel 130 can be similar to the plasma display panel 30 illustrated in FIG. 2.

The chassis base 150 can be made of a high thermal conductivity material that can serve as a heat dissipation sheet for the plasma display panel 130. One such material for the chassis base 150 is aluminum. Since the chassis base 150 supports the plasma display panel 130 which is made of glass, it is desirable that a reinforcing member 151 is installed on the back portion of the chassis base 150 to provide more reinforcing strength to the chassis base 150.

A circuit unit is installed on the back portion of the chassis base 150, and the circuit unit includes a plurality of circuit boards 163 that drive the plasma display panel 130. On the circuit boards 163, a plurality of circuit devices generating driving signals are mounted, and the generated driving signals are applied to the plasma display panel 130 after passing through connection cables 162 that are connected to the circuit boards 163 and extend toward the plasma display panel 130. An integrated circuit chip 161 can be mounted on the connection cable 162.

The heat dissipation sheet 140 is positioned between the plasma display panel 130 and the chassis base 150, and the heat dissipation sheet 140 can be attached to both of the plasma display panel 130 and the chassis base 150. Alternatively, the heat dissipation sheet 140 can be attached to a facing surface of the plasma display panel 130 through an adhesive unit (not shown) while being separated from the chassis base 150 by a predetermined distance as illustrated in FIG. 4.

Figure 5:
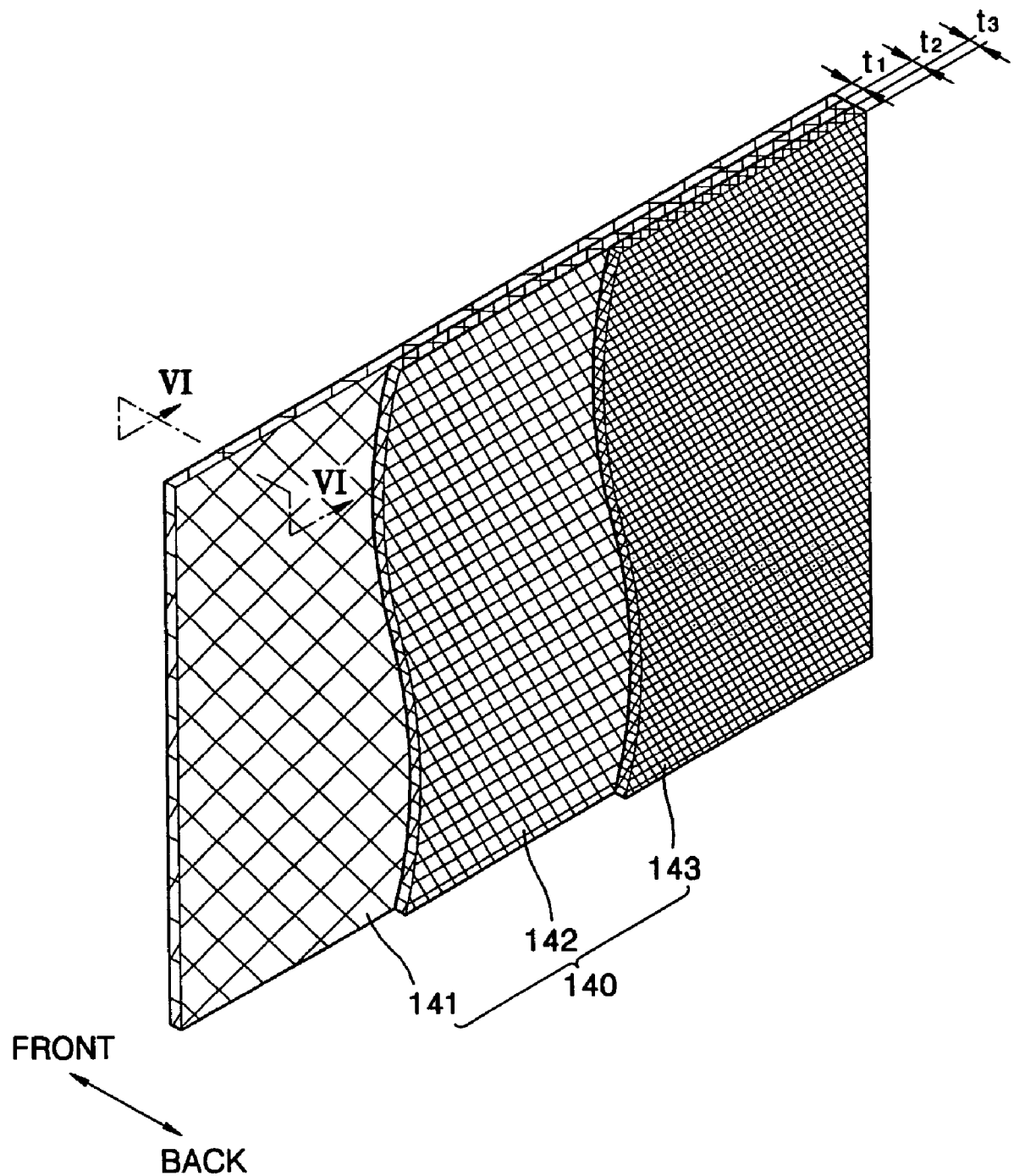
FIG. 5 is a partial cut perspective view of a heat dissipation sheet of FIG. 3.
Figure 6:
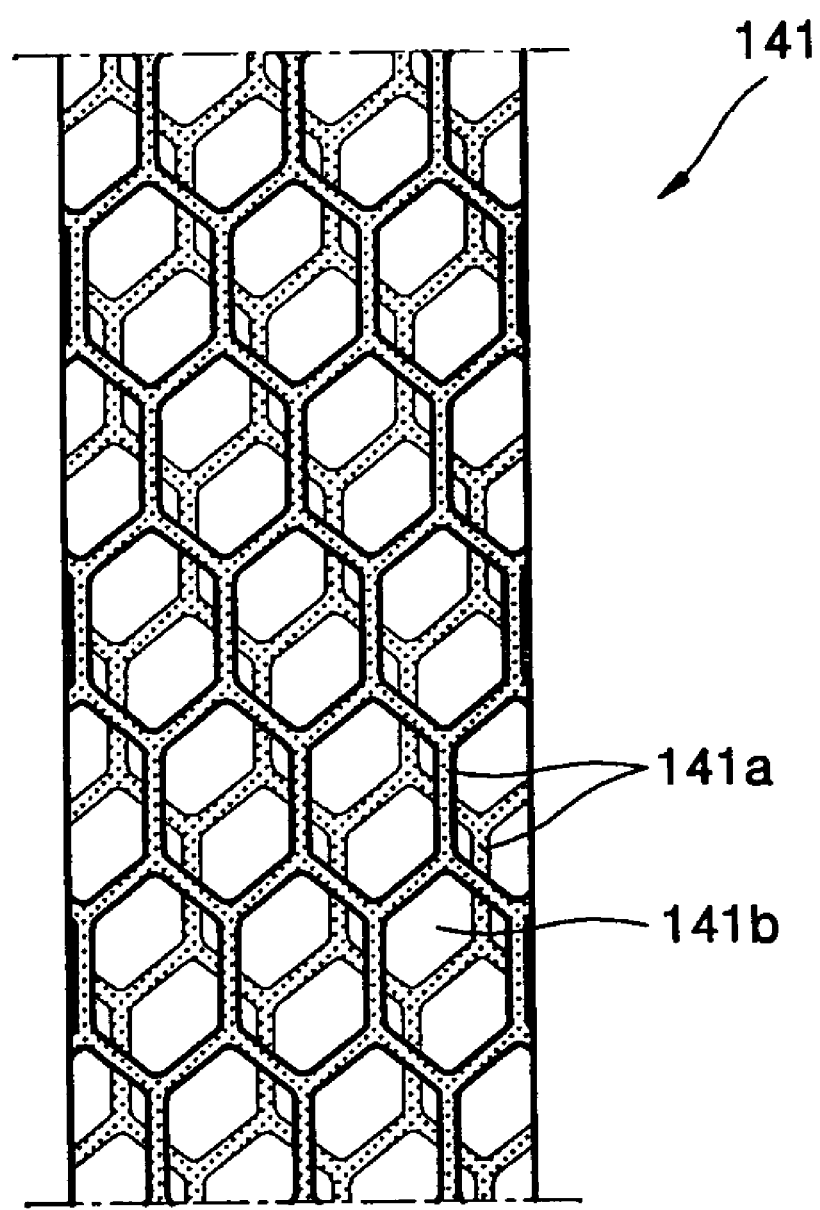
FIG. 6 is a cross-sectional view of the heat dissipation sheet taken along line VI-VI of FIG. 5.

Turning now to FIGS. 5 and 6, FIGS. 5 and 6 illustrate the heat dissipation sheet 140 of FIGS. 3 and 4 in detail. Referring to FIGS. 5 and 6, the heat dissipation sheet 140 is made out of a stack of sheets, including a first sheet material 141, a second sheet material 142, and a third sheet material 143, each being porous materials. The sheet materials 141, 142, and 143 can have different porosities from each other, and these can be arranged in an order of reducing porosities from the front (the plasma display panel 130 side) to back (the chassis base 150 side) of the heat dissipation sheet 140.

FIG. 6 is a cross-sectional view of first sheet material 141 taken along line VI-VI of FIG. 5. Referring to FIG. 6, the first sheet material 141 is shown as a network where thermally conductive material 141a forms a net, thus forming a plurality of open pores 141b that communicate with each other. The first sheet material 141 can be made of, for example, a porous carbon material. To form the porous carbon material, a mixture, in which a carbon-based material and a binder are evenly mixed, is molded and hardened to form a molding sheet. The molding sheet is then baked at a temperature of 1000° C. or higher in an inert gas atmosphere. Here, the carbon-based material can be carbon fiber, or petroleum coke powder, and the binder can be a material that is formed by mixing a thermosetting resin such as an epoxy resin with a petroleum pitch or a coal pitch. A similar process can also be used to make second sheet material 142 and third sheet material 143.

Alternatively, a high thermally conductive metal such as Al, Cu, Ag, and Ni can be foam-processed to fabricate the porous first sheet material 141 having a plurality of pores therein. For example, a high thermally conductive metal powder, a foaming agent, and a binder are melted to be mixed with each other, and molded to form a molding sheet, and the molding sheet is heated at a temperature of about 1500° C. in an inert atmosphere, and thus, the porous first sheet material 141 is formed. A similar process can also be used to make the second sheet material 142 and the third sheet material 143.

The pores 141b provide many advantages to heat dissipation sheet 140 of FIG. 3 over that of heat dissipation sheet 40 of FIG. 1. For example, the pores 141b included in the first sheet material 141 provide the heat dissipation sheet 140 with flexibility or a buffering property so that the discharge vibration generated by the plasma display panel 130 can be absorbed and the driving noise transmitted to the outside can be reduced or removed. Also, vibration generated during moving or shipping the plasma display module can be absorbed, and thus, the plasma display panel 130 made of glass material can be protected effectively. Even more so, since the air can be induced into the heat dissipation sheet 140 through the pores 142, the heat dissipation can be also achieved through air convection when pores 141b are present.

The heat dissipation sheet 140 is formed by stacking the sheet materials 141, 142, and 143, each having different porosities from each other, on to each other so that the resultant heat dissipation sheet 140 can effectively attenuate the vibration and noise generated by the discharge occurring in the plasma display panel 130. The heat dissipation sheet 140 can attenuate vibration and noise because the sheet materials 141, 142, and 143 that make up the heat dissipation sheet 140 have different porosities from each other and have different elastic strengths from each other. Therefore, the discharge vibration of a predetermined frequency is attenuated while passing through the sheet materials 141, 142, and 143 that respond to the discharge vibration differently from each other, and thus resonance can be prevented. In addition, the discharge noise caused by the vibration is also absorbed while passing through the heat dissipation sheet 140 having the pores, and the noise can be absorbed effectively since it passes through the heat dissipation sheet 140 made up of the materials having different porosities from each other. Here, "porosity" is the ratio of the volume occupied by the pores to the unit volume of the each sheet material, and the porosity can be changed by controlling sizes of the pores or density of the pores.

Although the heat dissipation sheet 140 of FIG. 5 is formed by stacking the sheet materials 141, 142, and 143 having different porosities from each other onto each other, the heat dissipation sheet 140 can instead be formed as a single body or as a single sheet by varying the porosity along a thickness direction (a direction from the plasma display panel 130 to the chassis base 150 running perpendicular to the heat dissipation sheet 140) thereof during fabrication of the heat dissipation sheet 140. For example, if a content or length of the carbon fiber varies along the thickness direction of the carbon-based material when the porous carbon-based material is fabricated, a single porous carbon-based sheet where the porosity varies along the thickness direction can be obtained. Here, if the content or the length of the carbon fiber varies in a stepwise fashion or continuously, the heat dissipation sheet 140 that has a porosity that varies in a stepwise or continuously manner respectively can be obtained.

Thicknesses t1, t2, and t3 of the sheet materials 141, 142, and 143 respectively can be chosen based on the vibration attenuation characteristics of the module, which can be determined by the measured or observed frequency of the vibration generated when operating the plasma display panel. That is, since the elastic strength of the heat dissipation sheet 140 is affected by the porosity of the entire heat dissipation sheet 140, when the thickness t1 of the first sheet material 141 having high porosity increases, the buffer property or the flexibility of the heat dissipation sheet 140 is increased. On the contrary, when the thickness t3 of the third sheet material 143 having low porosity increases, the flexibility of the heat dissipation sheet 140 is reduced and the rigidity is increased. Therefore, in designing the heat dissipation sheet 140, the thickness t1, t2 and t3 can be adjusted to achieve the desired degree of flexibility and rigidity.

Figure 7:
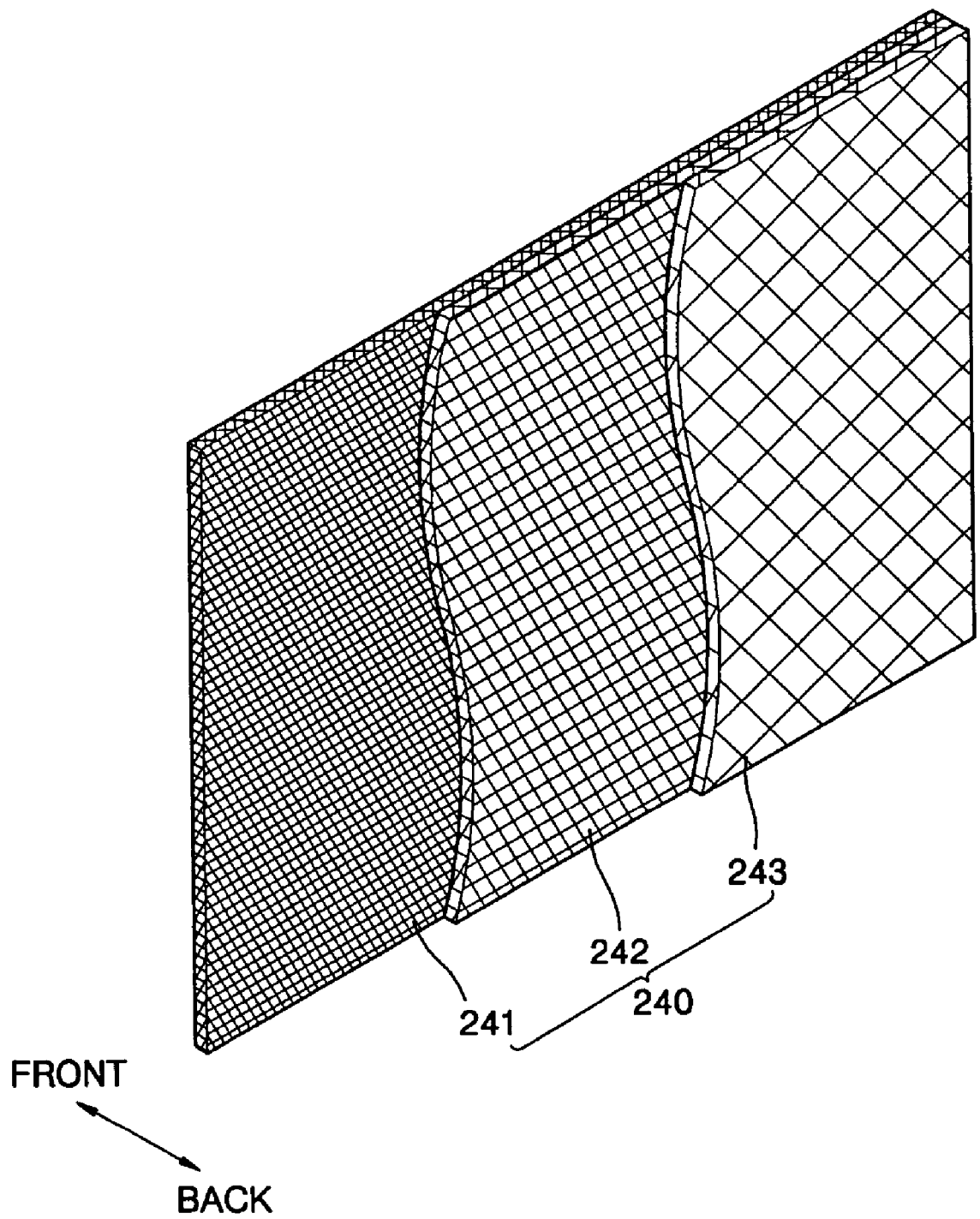
FIG. 7 is a partial cut perspective view of a heat dissipation sheet according to a second embodiment of the present invention.

Turning now to FIG. 7, FIG. 7 is a view of a heat dissipation sheet 240 adopted in a plasma display module according to a second embodiment of the present invention. The heat dissipation sheet 240 of the second embodiment is also formed by stacking together a first sheet material 241, a second sheet material 242, and a third sheet material 243, each having different porosities from each other. However, unlike the heat dissipation sheet 140 of FIG. 5, the sheet materials 241, 242, and 243 are arranged in an order of increasing the porosity from the front to the back of the heat dissipation sheet 240. The arrangement order can be changed according to the heat dissipating design. In the second embodiment, when the first sheet material 241 contacting the plasma display panel 130 has the smallest porosity, an area of the plasma display panel 130 directly contacting the thermal conductive material of the heat dissipation sheet 240 having the network structure is increased resulting in an increase of heat dissipation via conduction through the sheet.

Figure 8:
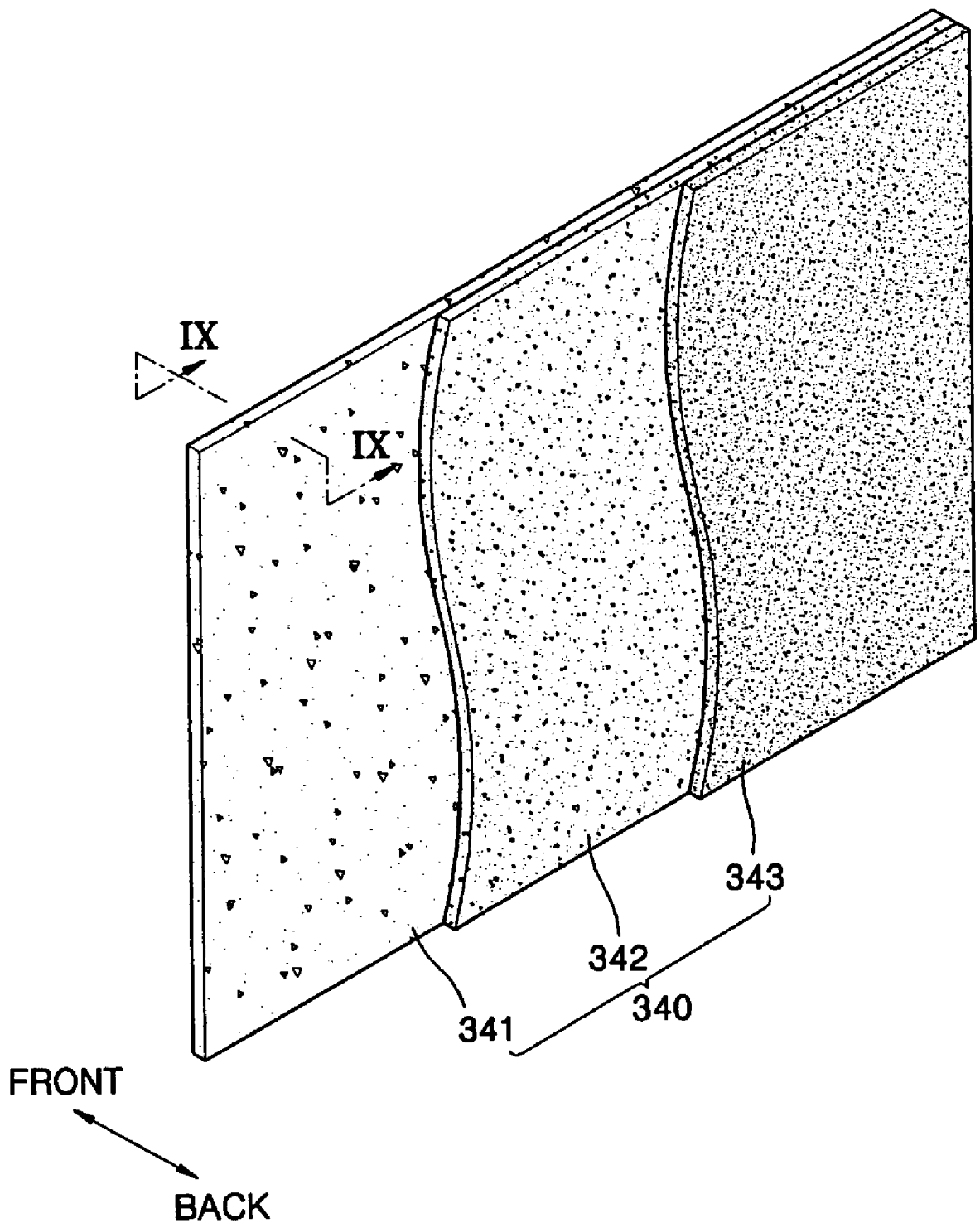
FIG. 8 is a partial cut perspective view of a heat dissipation sheet according to a third embodiment of the present invention.
Figure 9:
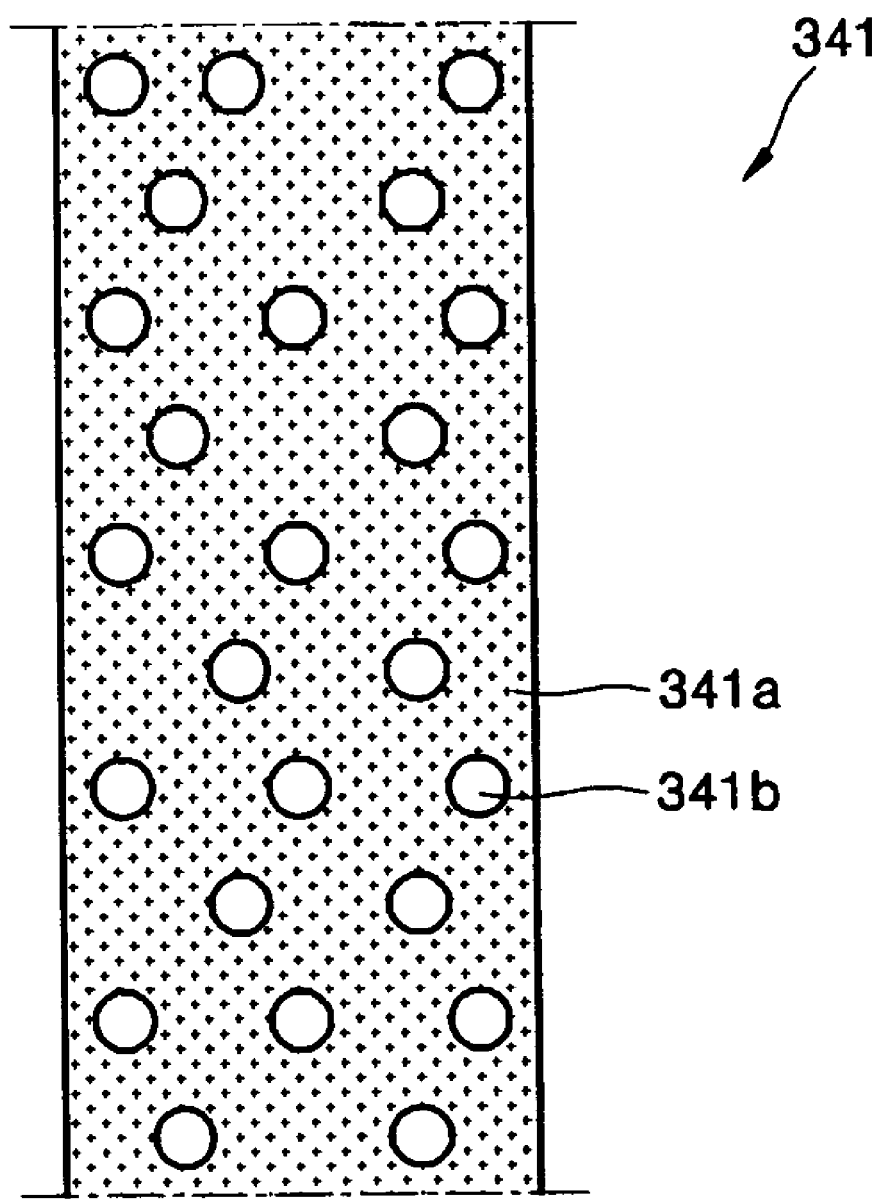
FIG. 9 is a cross-sectional view of the heat dissipation sheet taken along line IX-IX of FIG. 8.

Turning now to FIGS. 8 and 9, FIG. 8 is a view of a heat dissipation sheet 340 adopted in a plasma display module according to a third embodiment of the present invention, and FIG. 9 is a cross-sectional view of the heat dissipation sheet 340 taken along line IX-IX of FIG. 8. The heat dissipation sheet 340 is also formed by stacking a first sheet material 341, a second sheet material 342, and a third sheet material 343 together where each sheet has a different porosity from each other. The sheet materials 341, 342, and 343 are arranged in an order of reducing porosity from the front to the back of the heat dissipation sheet 340. Referring to FIG. 9, the first sheet material 341 has a sponge structure, that is, a plurality of closed pores 341b being formed to be isolated from each other in the thermally conductive material 341a. The heat dissipation sheet 340 can be formed of a porous carbon material as described above, and especially, the heat dissipation sheet of the sponge structure can be formed by foaming a thermally conductive material. In the heat dissipation sheet 340 of FIG. 8, the sheet materials 341, 342, and 343 forming the heat dissipation sheet 340 are arranged in the order of reducing the porosity from the front to the back of the heat dissipation sheet 340, however, they can instead be arranged in order of increasing the porosity thereof.

According to the present invention, the heat dissipation sheet can include three sheet materials, each having different porosities from each other. However, the number of stacked sheet materials can be greater or less than three if necessary. For example, the heat dissipation sheet can be made of only two sheet materials.

According to the plasma display module of the present invention, the vibration and noise transmitted to the outside and generated during the discharge occurring in the plasma display panel can be reduced or removed. The heat dissipation sheet having a plurality of pores is positioned between the plasma display panel and the chassis base, and thus, the vibration generated during the discharge of the plasma display panel can be absorbed by the heat dissipation sheet. In addition, since the porosity varies along the thickness direction of the heat dissipation sheet, the vibrations generated by the panel can be absorbed more effectively.

According to the present invention, the heat dissipating performance of the heat dissipation sheet can also be improved. The heat dissipation sheet is formed of a highly thermal conductive material to improve the heat dissipation performance. Furthermore, the air of low temperature can be induced into the heat dissipation sheet through the pores, allowing for heat dissipation by air convection.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A plasma display module, comprising:
a chassis base;
a plasma display panel arranged at a front portion of the chassis base, the plasma display panel being adapted to display images;
a heat dissipation sheet arranged between the plasma display panel and the chassis base, a front portion of the heat dissipation sheet being closest to the plasma display panel and a back portion of the heat dissipation sheet being closest to the chassis base, the heat dissipation sheet including a plurality of pores, wherein a porosity of the heat dissipation sheet varies with distance from the plasma display panel; and a circuit unit arranged at a back portion of the chassis base, the circuit unit being adapted to drive the plasma display panel, wherein the porosity of the heat dissipation sheet varies in stepwise increments from the front portion to the back portion of the heat dissipation sheet.

2. The plasma display module of claim 1, wherein the porosity of the heat dissipation sheet varies continuously from the front portion of the heat dissipation sheet to the back portion of the heat dissipation sheet.

3. The plasma display module of claim 1, wherein the heat dissipation sheet comprises at least two sheet materials, each sheet material having different porosities from each other.

4. The plasma display module of claim 1, wherein the heat dissipation sheet comprises a porous carbon material.

5. The plasma display module of claim 1, wherein the heat dissipation sheet comprises at least one thermal conductive material selected from the group consisting of Al, Cu, Ag and Ni.

6. The plasma display module of claim 1, the heat dissipation sheet being of a network, the heat dissipation sheet comprises a plurality of open pores.

7. The plasma display module of claim 1, wherein the heat dissipation sheet is arranged as a sponge structure, the heat dissipation sheet comprises a plurality of closed pores.

8. The plasma display module of claim 1, wherein the front portion of the heat dissipation sheet is attached directly onto a facing surface of the plasma display panel, and the back portion of the heat dissipation sheet is separated from the chassis base.

9. A plasma display module, comprising:
a chassis base;
a plasma display panel arranged at a front portion of the chassis base, the plasma display panel being adapted to display images;
a heat dissipation sheet arranged between the plasma display panel and the chassis base, the heat dissipation sheet being porous, a porosity of the heat dissipation sheet varying at different locations within the heat dissipation sheet; and
a circuit unit arranged at a back portion of the chassis base, the circuit unit being adapted to drive the plasma display panel, the heat dissipation sheet having a porosity that varies only in a thickness direction, the thickness direction being a direction from the plasma display panel to the circuit unit and being perpendicular to surfaces of the heat dissipation sheet.

10. The plasma display module of claim 9, the porosity within the heat dissipation sheet varying continuously along the thickness direction.

11. The plasma display module of claim 9, the porosity within the heat dissipation sheet varying discontinuously in a stepwise fashion along the thickness direction.

12. A plasma display module, comprising:
a chassis base;
a plasma display panel arranged at a front portion of the chassis base, the plasma display panel being adapted to display images;
a heat dissipation sheet arranged between the plasma display panel and the chassis base, the beat dissipation sheet being porous, a porosity of the heat dissipation sheet varying at different locations within the heat dissipation sheet; and
a circuit unit arranged at a back portion of the chassis base, the circuit unit being adapted to drive the plasma display panel, the heat dissipation sheet comprising three sub-sheets stacked onto each other, each of the three sub-sheets having porosities different from each other.

13. The plasma display module of claim 12, each sub-sheet having a porosity that is uniform throughout the entire sub-sheet.

14. The plasma display module of claim 12, one of the three sub-sheets having the lowest porosity being arranged closest to the plasma display panel and another of the three sub-sheets having the highest porosity being arranged closest to the circuit unit.

15. The plasma display module of claim 12, one of the three sub-sheets having the highest porosity being arranged closest to the plasma display panel and another of the three sub-sheets having the lowest porosity being arranged closest to the circuit unit.

16. The plasma display module of claim 12, the pours in each of the three sub-sheets being open pours where the pours are so big that they are connected to each other.

17. The plasma display module of claim 12, the pours in each of the three sub-sheets being closed pours where the pours are so small that they are completely surrounded with solid material and the pours do not connect with each other.

* * * * *